United States Patent
Frey et al.

(10) Patent No.: US 7,068,110 B2
(45) Date of Patent: Jun. 27, 2006

(54) PHASE ERROR CANCELLATION

(75) Inventors: Doug Frey, Bethlehem, PA (US); Axel Thomsen, Austin, TX (US); Ligang Zhang, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 10/878,089

(22) Filed: Jun. 28, 2004

(65) Prior Publication Data

US 2005/0285685 A1    Dec. 29, 2005

(51) Int. Cl.
    *H03L 7/00* (2006.01)
(52) U.S. Cl. .................. 331/17; 327/147; 327/156
(58) Field of Classification Search ............ 331/16–18,
    331/25, 1 A, 1 R, DIG. 2; 327/115, 117,
    327/147, 156, 162, 163; 375/375, 376
    See application file for complete search history.

(56) References Cited

U.S. PATENT DOCUMENTS

| | | | | |
|---|---|---|---|---|
| 5,038,117 A | * | 8/1991 | Miller | 331/16 |
| 5,337,024 A | * | 8/1994 | Collins | 332/127 |
| 5,604,468 A | | 2/1997 | Gillig | 331/276 |
| 5,781,044 A | * | 7/1998 | Riley et al. | 327/105 |
| 5,790,614 A | | 8/1998 | Powell | 375/376 |
| 5,834,987 A | | 11/1998 | Dent | 332/127 |
| 5,847,611 A | * | 12/1998 | Hirata | 331/1 A |
| 6,008,703 A | | 12/1999 | Perrott et al. | 332/100 |
| 6,044,124 A | | 3/2000 | Monahan et al. | 375/376 |
| 6,236,703 B1 | * | 5/2001 | Riley | 377/48 |
| 6,404,246 B1 | | 6/2002 | Estakhri et al. | 327/156 |
| 6,456,164 B1 | | 9/2002 | Fan | 331/16 |
| 6,509,800 B1 | * | 1/2003 | Stockton | 331/11 |
| 6,570,453 B1 | | 5/2003 | Su et al. | 331/1 A |
| 6,670,854 B1 | * | 12/2003 | Takeda et al. | 331/1 A |
| 6,917,317 B1 | * | 7/2005 | Nagaso et al. | 341/131 |
| 2002/0140512 A1 | | 10/2002 | Stockton | 331/11 |

FOREIGN PATENT DOCUMENTS

EP    1 345 375 A2    9/2003

OTHER PUBLICATIONS

De Muer, Bram, and Steyaert, Michel S. J., "A CMOS Monolithic ΔΣ-Controlled Fractional-N Frequency Synthesizer for DCS-1800," IEEE Journal of Solid-State Circuits, vol. 37, No. 7, Jul. 2002, pp. 835-844.

(Continued)

*Primary Examiner*—Timothy P. Callahan
*Assistant Examiner*—Hai L. Nguyen
(74) *Attorney, Agent, or Firm*—Zagorin O'Brien Graham LLP

(57) ABSTRACT

A noise cancellation signal is generated for a fractional-N phase-locked loop by supplying a divide value to a first delta sigma modulator and generating a divide control signal in a first delta sigma modulator to control a divide value of a feedback divider in the phase-locked loop. The first delta sigma modulator integrates an error term indicative of a difference between a value of the generated divide control signal and the divide value supplied to the first delta sigma modulator. A phase error cancellation signal is generated by quantizing the integrated error term using a second delta sigma modulator. The error term can be used by the second delta sigma modulator while quantizing the integrated error term, thereby limiting the low pass filter effects of the second delta sigma modulator in the cancellation signal.

32 Claims, 5 Drawing Sheets

OTHER PUBLICATIONS

Pamarti, Sudhakar, et al., "A Wideband 2,4-GHz Delta-Sigma Fractional-N PLL With 1-Mb/s In-Loop Modulation," IEEE Journal of Solid-State Circuits, vol. 39, No. 1, Jan. 2004, pp. 49-62.

Riley, Tom A. D., et al., "Delta-Sigma Modulation in Fractional-N Frequency Synthesis," IEEE Journal of Solid-State Circuits, vol. 28, No. 5, May 1993, pp. 553-559.

Perrott, Michael H., et al., "A 27-mW CMOS Fractional-N Synthesizer Using Digital Compensation for 2.5-Mb/s GFSK Modulation," IEEE Journal of Solid-State Circuits, vol. 32, No. 12, Dec. 1997, pp. 2048-2060.

Sumi, Yasuaki, et al., "Novel Fractional-N PLL Frequency Synthesizer with Reduced Phase Error," Proceedings of IEEE Asia Pacific Conference on Circuits and Systems '96, Nov. 18-21, 1996, Seoul, Korea, pp. 45-48.

* cited by examiner

PHASE ERROR CANCELLATION

CROSS-REFERENCE TO RELATED APPLICATION(S)

BACKGROUND

1. Field of the Invention

This invention relates to phase-locked loops and more particularly to phase error correction in phase-locked loops.

2. Description of the Related Art

Phased-locked loops (PLLs) control an oscillator output signal so that it maintains a desired relationship with an input reference signal. The desired relationship may be to maintain a particular phase/frequency relationship with the input reference signal. PLL circuits are commonly used to multiply and divide the input reference signal. Some PLL implementations restrict the PLL output signal to be an integer multiple of an input reference signal supplied to the PLL. Other PLL implementations provide more versatility and allow the PLL output signal to be a non-integer multiple of the input reference signal. FIG. 1 illustrates one such PLL known as a fractional-N phase-locked loop.

The PLL 100 compares the reference signal supplied on node 101 to a feedback signal supplied on node 103 in phase/frequency detector 105. That difference is used to drive the charge pump and loop filter 107, which in turn supplies the voltage controlled oscillator 109 with a control signal to adjust its output based on the comparison of the input reference signal and the feedback signal. Fractional-N PLLs typically have a delta sigma modulator 113 that receives a rational number M as a divide ratio that corresponds to the desired output frequency and supplies a sequence of integers M' to the feedback divider 111. The sequence of integers averages the divide ratio M and the divider adjusts its divide value based on the received sequence. In that way, the PLL outputs a signal having an average frequency corresponding to M. However, while the average frequency output may be correct, phase errors are introduced into the VCO output signal because the divide ratio M' is not equal to the desired divide ratio M.

Since the sequence of integers provided to the feedback divider is known, the error introduced into the system, i.e., the difference between the divider value M' generated by the delta sigma modulator and the desired divider value M can be determined. That error shows up at the front end of the phase-locked loop at the phase/frequency detector 105. By utilizing the error introduced into the system by the fractional-N divider, i.e., the difference between the M and M', a phase error correcting circuit (PEC) can determine the phase error introduced and supply to the charge pump a phase error correction signal that offsets the introduced error at the front end of the PFD.

Generally, the goal of phase error correction is to generate a phase error correction signal that closely matches the actual phase error. The phase error correction signal may first be determined digitally. Typically a digital to analog converter circuit then converts the digital representation of the phase error correction signal to an analog signal that can used by the charge pump to offset the phase error. However, the digital phase error correction signal generally has significantly more bits than can be converted accurately or quickly enough by a digital to analog converter (DAC), so the digital phase error correction signal is typically truncated prior to being supplied to the DAC. However, simply truncating the phase error correction signal causes the phase error correction signal to have a noise spectrum that has significant energy in frequency bands of interest. To reduce this problem, some approaches have utilized noise shaping to improve the noise spectrum of the quantized phase error correction signal.

However, for certain applications some noise shaping techniques may not meet stringent noise specifications. Accordingly, it would be desirable to provide improved techniques for phase error correction.

SUMMARY

In one embodiment a method is provided for generating a noise cancellation signal in a fractional-N phase-locked loop. The method includes supplying a divide value to a first delta sigma modulator and generating a divide control signal in a first delta sigma modulator to control a divide value of a feedback divider in the phase-locked loop. The first delta sigma modulator integrates an error term indicative of a difference between a value of the generated divide control signal and the divide value supplied to the first delta sigma modulator. A phase error cancellation signal is generated by quantizing the integrated error term using a second delta sigma modulator. The method may further include utilizing the error term in the second delta sigma modulator in the process of quantizing the integrated error term, thereby limiting the low pass filter effects of the second delta sigma modulator in the cancellation signal.

In another embodiment an integrated circuit includes a fractional N phase-locked loop circuit including a feedback divider circuit coupled to receive a divide control signal that approximates a divide value over time. An integrator receives an error signal and supplies an integrated error signal, the error signal being a difference between the divide value and the divide control signal. A first delta sigma modulator receives the integrated error signal and the error signal and generates a cancellation signal to correct phase errors in the phase-locked loop introduced by the feedback divider circuit.

In another embodiment a method is provided for generating a noise cancellation signal in a delta-sigma fractional-N phase-locked loop that includes supplying an error term and an integrated error term to a delta sigma modulator circuit, the error term indicating a difference between a first divide signal and a second divide signal supplied to a divider circuit in the phase-locked loop; and generating a phase error cancellation signal by quantizing the integrated error term using a delta sigma modulator.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 2:
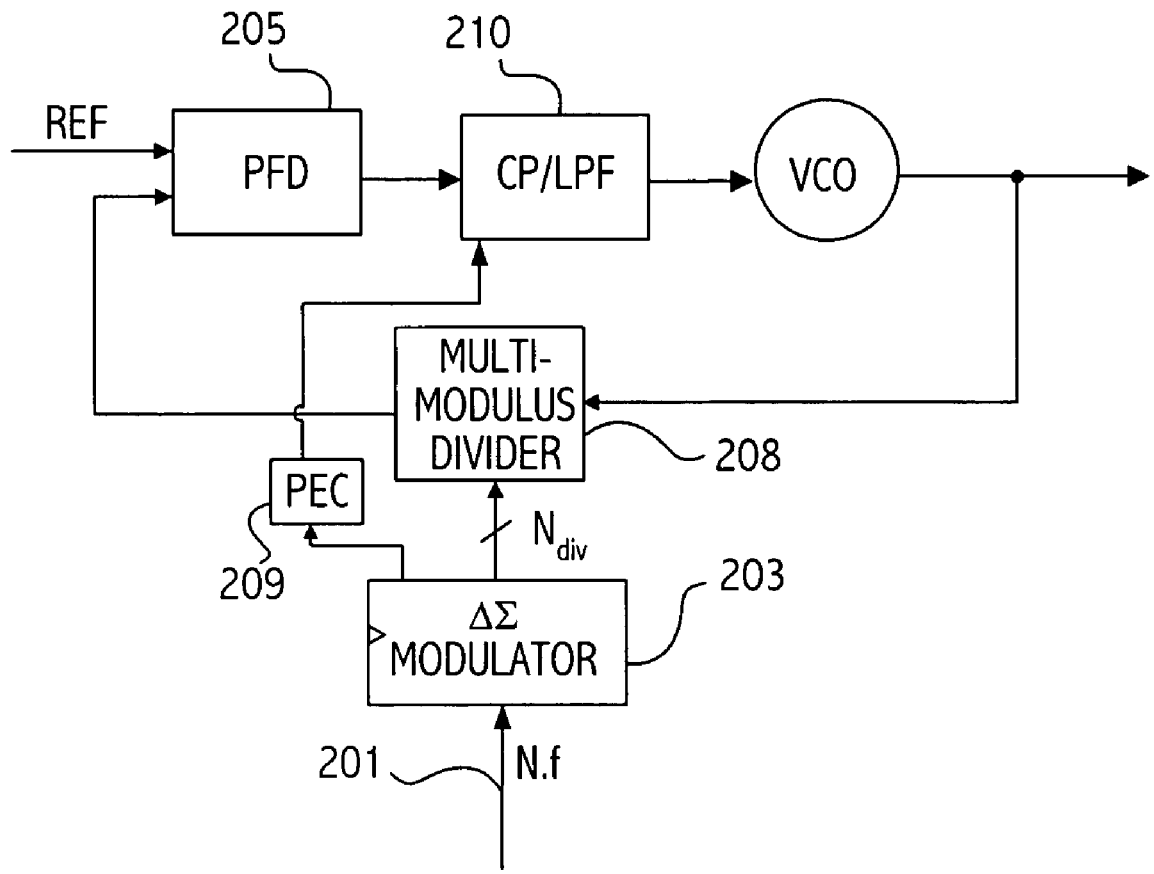
FIG. 2 is an exemplary system that can utilize the phase error correction approach described herein.

FIG. 2 illustrates an exemplary system that can utilize the phase error correction approach described herein. Referring again to FIG. 2, the divide control signal N.f supplied on node 201 is a rational number having an integer portion N and a fractional portion f. The divide control signal may be a slowly varying fractional-N divide signal that drives the delta-sigma modulator 203. The delta sigma modulator 203 produces a sequence of integers $N_{div}$, close in value to the divide signal N.f, in such a way that the average value of $N_{div}$ equals the divide signal N.f. Because integers are always somewhat different than the divide signal value, a phase error, $\Delta\phi$, is produced at each update time. By carefully following the action of the system the net result of these phase errors at the input of the PLL—that is, at the input to phase and frequency detector (PFD) 205 can be determined. The phase error correction (PEC) circuit 209 is utilized to generate the phase error correction signal and supplies the signal to the charge pump 210.

To understand the phase error computation assume that the VCO frequency is in equilibrium and is given exactly by $f_{vco}=(N.f)f_{ref}$ where, as in FIG. 2, N.f is a number whose integer part is N and whose fractional part is f. The fractional-N delta-sigma converter 203 produces a sequence of integers, each denoted by $N_{div}$, that are applied to the programmable divider 208 to approximate N.f. Thus, the time error at the input $\Delta\tau_{in}$, evolves according to this equation:

$$\Delta\tau_{in}^{k+1} = \Delta\tau_{in}^{k} + (N \cdot f - N_{div}^{k})\frac{1}{f_{VCO}}$$

In practice, of course, N.f and $f_{VCO}$, may also change with time; however, for simplicity assume that those changes are relatively slow. This equation shows that the time error at the input at any instant in time is given by the sum of the time errors at each update time. In one embodiment of a delta-sigma fractional-N converter, the integer part of N.f may be stripped off and added back in at the output to produce the final integer, $N_{div}$. As a result, the delta-sigma converter produces a small integer, $N_f$, that may be negative, at each update time. Hence, we may write, $$N_{div}^{k} = N + N_{f}^{k} \Rightarrow \Delta\tau_{in}^{k+1} = \Delta\tau_{in}^{k} + (f - N_{f}^{k})\frac{1}{f_{VCO}}$$

Notice that each unit increment of the integer divider adds a delay of exactly one VCO unit interval, thereby increasing the input time error by exactly one VCO unit interval. Therefore, there is an exact correspondence between the fractional value, f, and the absolute time, f times the VCO unit interval. Because of this one may choose to express the above relation in terms of VCO unit intervals with a new variable, $T_{in}$, related to $\Delta\tau_{in}$ in the following way. Specifically, $$T_{in}^{k+1}=T_{in}^{k}+(f-N_f^k), \text{ where } T_{in}=\Delta\tau_{in}f_{VCO}$$

This relation is the one which relates the internal computations of the delta-sigma converter to the time errors at the input of the PFD in such a way that the PEC scheme can be implemented.

Determining the phase error correction signal at the update rate of the loop, as compared, e.g., to an oversampling approach, saves power due to use of a slower clock and simplifies design. In an exemplary embodiment, the update rate is approximately 20 MHz. In an oversampling approach phase error correction signals would be generated at a rate being a multiple of the update rate, in this case 40 MHz or 80 MHz for example.

Figure 3:
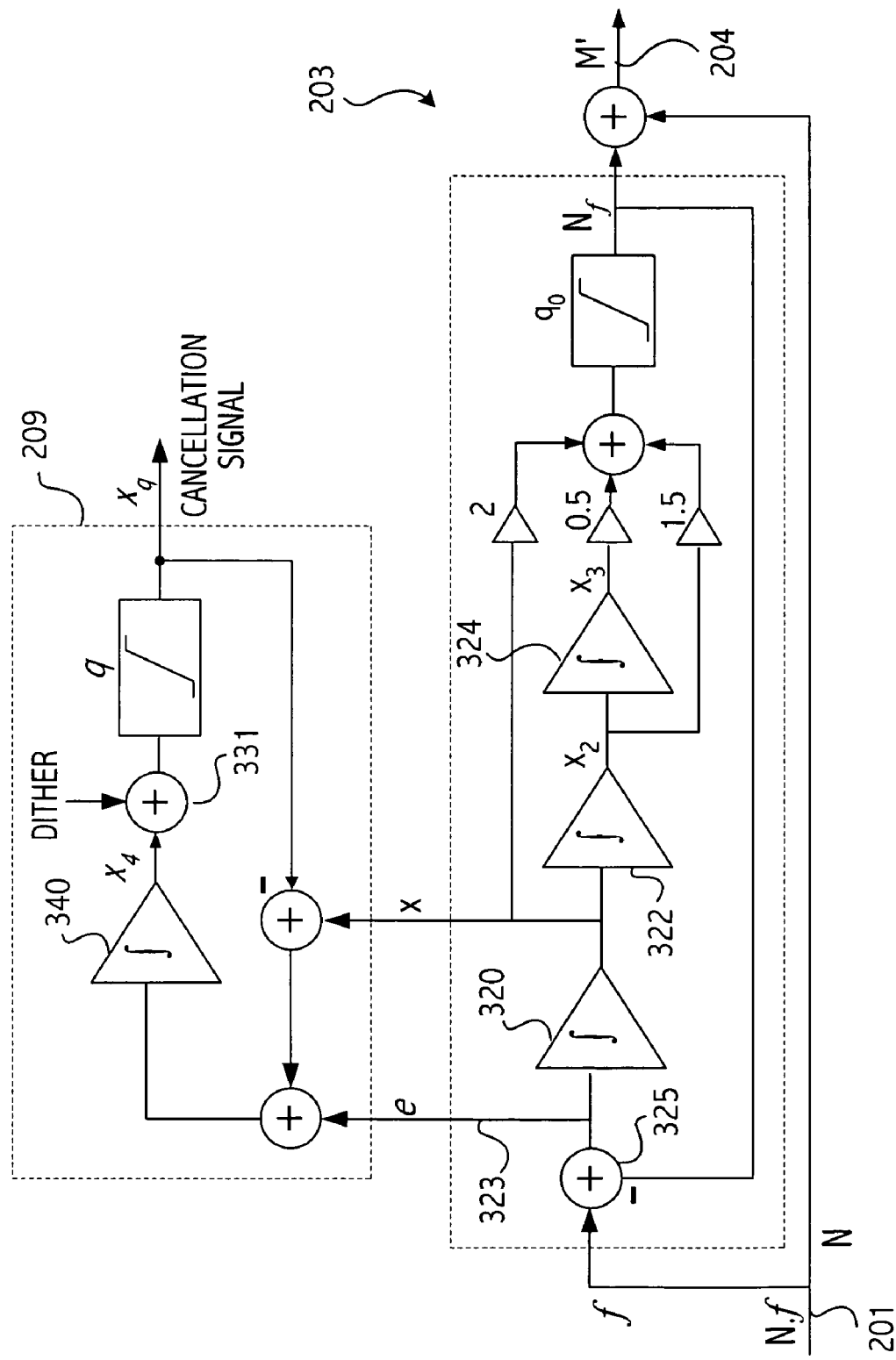
FIG. 3 illustrates fractional-N and PEC delta-sigma modulators according to an embodiment of the invention.

FIG. 3 illustrates a block diagram of an embodiment of the fractional-N delta-sigma converter 203 and the phase error correction (PEC) delta-sigma converter 209. The fractional-N delta sigma converter 203 receives the fractional-N input, N.f on node 201 and supplies the divider control output, $N_{div}$ on node 204. The integrators 320, 322, and 324, correspond to digital accumulators. In the delta sigma modulator 203, the three accumulator output values are called, x, $x_2$, and $X_3$. The output of accumulator 340 in the phase error correction delta sigma modulator 209 has been designated, $x_4$. The output of the PEC delta sigma modulator 209 is supplied to a digital to analog converter (DAC) (not shown in FIG. 2) and supplied to the charge pump 210 to correct the phase error.

The operation of the delta sigma modulator 203 is characterized by the following equations:

$$x^{k+1}=x^k+f-N_f^k$$

$$x_2^{k+1}=x_2^k+x^k$$

$$x_3^{k+1}=x_3^k+x_2^k$$

$$N_f^k=\text{trunc }[2x^k+1.5x_2^k+0.5x_3^k]$$

The operator, "trunc", denotes truncation which accomplishes the quantizer function. Note that the signal supplied on node 323 ($f-N_f$) from summing circuit 325 describes the frequency error between the fractional part of the approximated divide signal provided by the delta sigma modulator 203 and the fractional part of the desired divide value N.f Since phase is the integration of frequency, when the frequency error is integrated in integrator 320, the result x is the phase error. It is that phase error that needs to be corrected in the phase locked loop.

Observe that the update equation for the phase error x is identical to that for $T_{in}$ above, which explains why this signal is used to derive the control for the phase error correction (PEC) digital to analog converter (DAC) (not shown in FIG. 2). However, because of the finite precision of the PEC DAC (which may be for example, 8 or 9 bits depending upon the application requirements and circuit capabilities), x should be truncated in such a way that the quantization noise is reduced to an acceptable level. It is this requirement that necessitates the introduction of the PEC delta sigma modulator.

As can be seen by analyzing FIG. 3, the following equations describe the behavior of the PEC delta sigma modulator 209.

$$x_4^{k+1} = x_4^k + e^k + (x^k - x_q^k)$$

$$= x_4^k + (f - N_f^k) + (x^k - x_q^k)$$

-continued $$x_q^k = trunc[x_4^k + dither]$$

These results demonstrate that the signal $x_q$ equals x (and $T_{in}$) plus first order shaped quantization noise, given by $(x_q^k-x_4^k)$, introduced by the combination of the dither signal and the quantizer in the PEC DS modulator. Note that the dither signal, added in summing circuit 331 to the output $x_4$ of integrator 340 may be supplied e.g., by a pseudo random noise source, or be derived directly, e.g., from the phase error signal "e" since it has desirable random behavior in its top bits. Specifically, the dither signal is may be derived by dividing "e" by $2^N$, where N would equal the number bits saved by the "trunc" operator. That saves additional circuitry as opposed to implementing a separate pseudorandom noise source.

Figure 1:
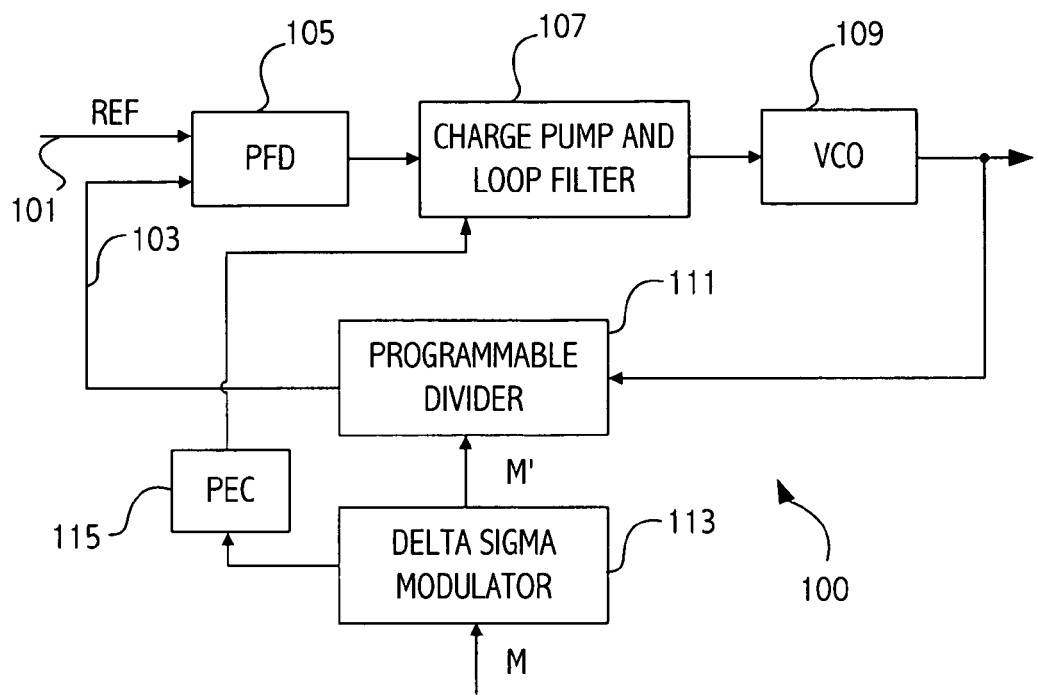
FIG. 1 is a block diagram of a prior art phase-locked loop with phase error correction.

The "error signal", $f-N_f$, should be integrated purely, experiencing no additional filtering. Quantizing the phase error "x" utilizing a delta sigma modulator can lead to additional filtering inherent in the delta sigma modulator that leads to additional phase noise as explained later. While the use of delta sigma modulation to quantize the phase error "x" can lead to acceptably low noise energy in the frequency band of interest, the energy can rise rapidly just past the cutoff frequency of the PLL. For some applications, even that noise energy is unacceptable. Thus, as further described herein, care should be taken to avoid any additional filtering of the error term. Otherwise, a delta sigma modulator operating at the frequency of the loop update rate (the frequency of reference signal 101 in FIG. 1) may not produce suitable performance levels that may be needed to cancel the fractional-N noise in the phase and frequency detector.

As described above, the number of bits supplied to the DAC should be reduced or minimized to allow for the best compromise in speed, accuracy, and complexity. In one embodiment, a 9 bit DAC, having a dynamic range that extends to + and −2 unit intervals of a PLL output clock is sufficient if appropriate shaping is applied to the 9 bit digital cancellation (PEC) signal. That allows the shaping to be done at the update rate. The quantization error associated with truncation to 9 bits would be excessive for many applications.

Figure 4:
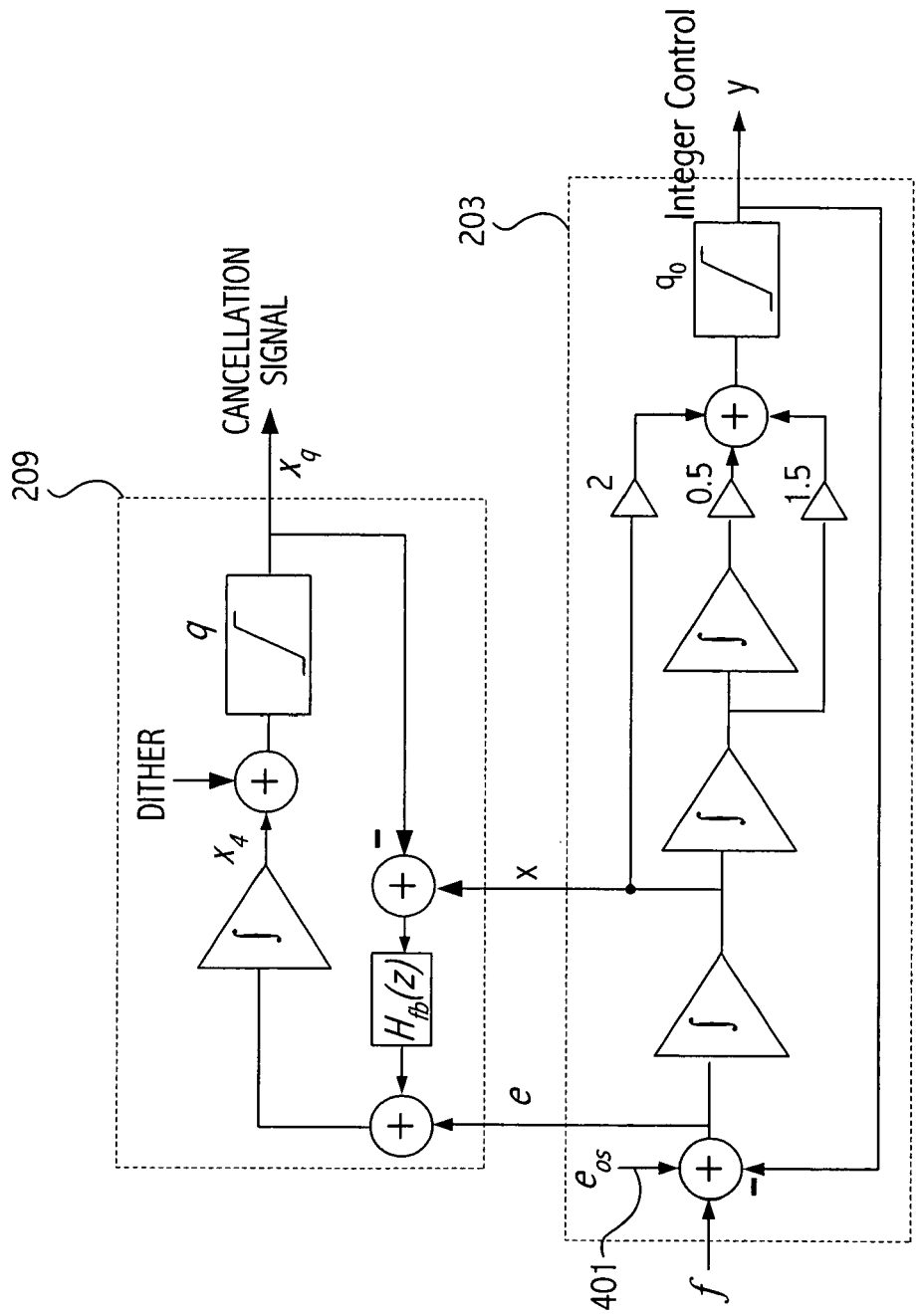
FIG. 4 illustrates another perspective of the fractional N and PEC delta sigma modulators according to an embodiment of the invention.

FIG. 4 describes the system of FIG. 3 from a slightly different perspective in accordance with the equations below. The system described in FIGS. 3 and 4 is particularly efficient in its processing of the cancellation signal. Note that FIG. 4 illustrates processing only the fractional component in delta sigma modulator 203. One reason for that efficiency is that both the error term e and the integration term x are generated in the delta sigma modulator providing the divider control signal rather than having to be generated in separate PEC logic. The basic equations governing the behavior of the main delta sigma modulator 209 shown in FIG. 4 are given below, where z denotes the usual z-transform operator:

$$y=H(z)f+(1-H(z))q_0;\ e=(1-H(z))(f-q_0);\ x=I(z)e$$

Note that $q_0$ and q denote the dither (when applicable) plus quantization error outputs of the main delta-sigma modulator 203 and the secondary error shaping PEC delta-sigma modulator 209, respectively. Note also that while delta sigma modulator 203 is shown in FIGS. 3 and 4 as a third order loop, in fact use of a second order loop may result in similar or even better phase error correction performance.

Note that dithering may be utilized using a small additive constant $e_{os}$ supplied on node 401. With this dithering approach, the higher order system tends to substantially eliminate unwanted tones. Since the offset, $e_{os}$, is intended to be a tiny DC signal, less than the LSB of the input, $f$ no significant error is introduced by lumping the offset term with $f$. This may be assumed already in writing the above equations. H(z) denotes the input-output transfer function of the main delta sigma modulator and I(z) is meant to represent the digital integrator transfer function. Now the equations can be solved to find the quantized integrator output, $x_q$, as shown below. The feedback transfer function, $H_{fb}(z)$, may be as simple as 1, as in FIG. 3, or may incorporate an integrator or more digital signal processing to allow higher order noise shaping of the PEC signal.

$$x_q = I(z)[e + H_{fb}(z)(x - x_q)] + q \quad (1)$$

$$\therefore x_q = \frac{I(z)}{1 + I(z)H_{fb}(z)}(e + H_{fb}(z)x) + \frac{1}{1 + I(z)H_{fb}(z)}q$$

$$= \frac{I(z)}{1 + I(z)H_{fb}(z)}(e + H_{fb}(z)I(z)e) + H_{PEC-0}(z)q$$

$$= I(z)e + H_{PEC-0}(z)q$$

where $H_{PEC-0}(z) = \dfrac{1}{1 + I(z)H_{fb}(z)}$

Figure 5:
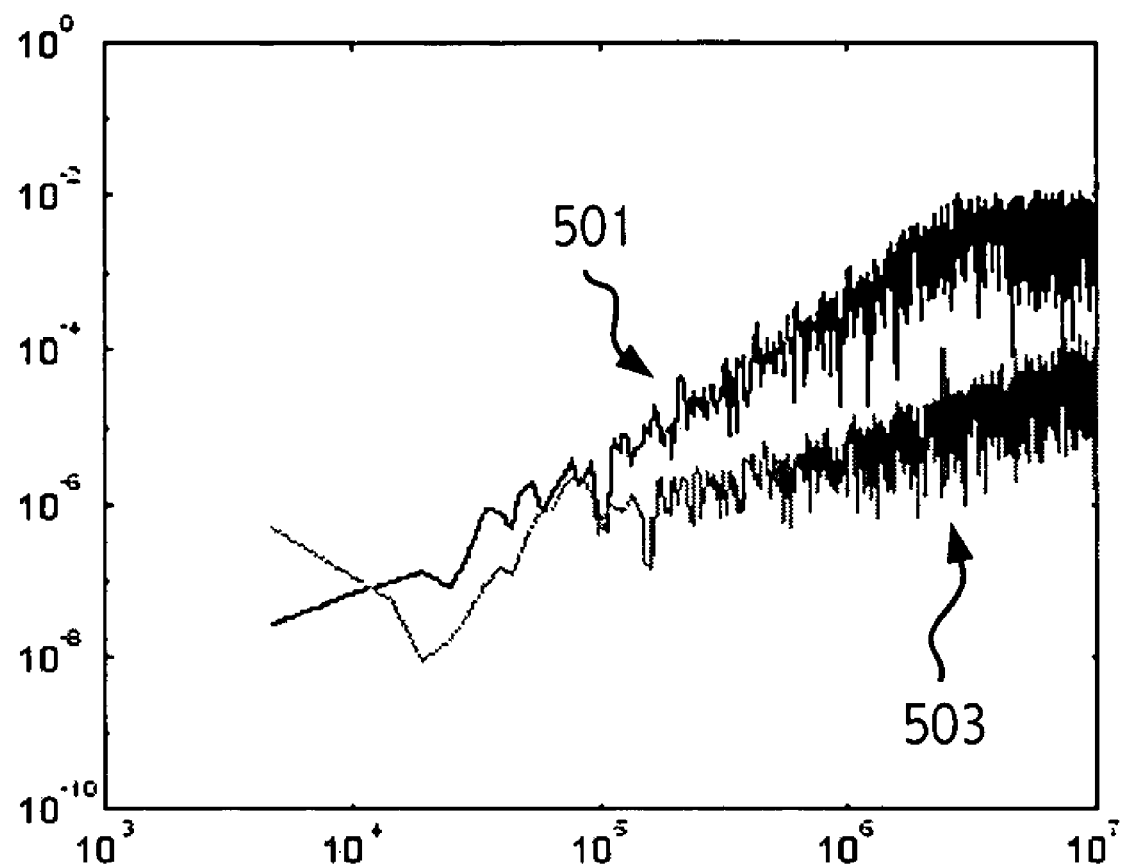
FIG. 5 illustrates an exemplary noise spectra of the integrated error signal that should be ideally cancelled at the front end of the PLL, and the shaped PEC DSM quantizer noise.

The transfer function $H_{PEC-0}$, represents the highpass noise shaping function of the PEC DSM. The analogous noise shaping function for the main delta-sigma modulator 203 is given by 1−H(z). Observe that the quantized output of the PEC delta sigma modulator (DSM) equals the sum of the ideally integrated error signal, e, represented as (I(z)e), and the shaped version of the quantization error introduced by the PEC DSM quantizer. For illustration, FIG. 5 (x-axis frequency, y-axis log amplitude) shows an exemplary noise spectra 501 of the integrated error signal—that is, the signal which must be ideally cancelled at the front end of the PLL—and the shaped PEC DSM quantizer noise 503—that is, the noise signal which will ideally be left if the optimum cancellation is achieved at the front end. In generating this figure, a third order fractional-N DSM and a first order PEC DSM were used. Although the residual is not free of tones, they may not to be worth eliminating. At this point it is valuable to observe that the phase noise spectrum left at the front end of the PLL after phase error cancellation will appear lowpass filtered by the closed loop response of the PLL at the output. It is this fact that makes the shaping of the phase noise spectrum so important in fractional-N PLLs. For example, with no phase error cancellation, the spectrum 501 would appear lowpass filtered at the output of PLL. Hence, if the closed loop cutoff frequency of the PLL were significantly below the knee of the spectrum 501, then only the small noise at low frequencies would appear at the output. However, observe that if the closed loop bandwidth were closer to the knee of the spectrum then much of the noise would still appear at the output. This explains the need for the phase error cancellation. Given the residual spectrum 503 resulting from the envisioned phase error cancellation, it is clear that even with a closed loop cutoff frequency near the knee of the spectrum 501 significant noise reduction is achieved.

In one approach, described in "A Wideband 2.4-GHz Delta-Sigma Fractional-N PLL with 1-Mb/s In-Loop Modulation" IEEE Journal of Solid-State Circuits, vol 39, No 1, January 2004, Pamarti et al., the error signal corresponding to e in FIG. 4 is quantized using a delta-sigma converter of its own to produce a quantized error signal, $e_q$. That signal is integrated to produce the phase error cancellation signal $x_{q\text{-}other}$ to distinguish the signal from $x_q$ described in FIGS. 3 and 4. Understanding the quantization noise associated with this approach will help point out the advantages of the embodiments of the invention described herein. The equations describing how this signal relates to the quantization noise components are as follows $$\begin{aligned} x_{q\text{-}other} &= I(z)e_q \\ &= I(z)(H_{PEC}(z)e + H_{PEC\text{-}Q}(z)q) \\ &= H_{PEC}(z)I(z)e + H_{PEC\text{-}Q}(z)I(z)q \end{aligned} \quad (2)$$

The transfer function, $H_{PEC}$, denotes that of the DSM added in this case. The transfer functions $H_{PEC\text{-}Q}$ and $H_{PEC\text{-}0}$ (in equation (1) and (2) above), are analogous to one another in that they represent the highpass noise shaping functions on the PEC DSM for the respective cases. There are several aspects to note regarding the comparison between equations (1) and (2) above. First, observe that in the expression for $x_q$ the error, e, appears in a purely integrated form, where as in the expression for $x_{q\text{-}other}$ the error, e, is integrated and also filtered by the lowpass filter function, $H_{PEC}$, of the PEC delta sigma converter. In practice, this is a lowpass filter function with a cutoff frequency of roughly 1/10 times the sampling rate. Therefore, even if the additional quantization noise due to the term including q is negligible, perfect phase error cancellation is impossible, regardless of the quality of the analog circuitry employed. This is because the noise at frequencies near and above the cutoff frequency of the DSM transfer will not be cancelled. Note that even small phase shifts introduced by filtering below the cutoff frequency will be enough to dramatically limit the cancellation achievable. If the PLL bandwidth is restricted to something well below the cutoff frequency of the $H_{PEC}$ then very good performance may still be achieved, as suggested by looking at FIG. 5, but this places a severe restriction on the system. The second aspect worthy of note is that the PEC delta sigma converter quantization noise appears integrated in the result for $X_{q\text{-}other}$, unlike its counterpart in the result for $x_q$. This necessitates the use of a higher order PEC delta sigma modulator to achieve similar performance to that of the present invention. If the output of the integrated version of e is quantized by the PEC delta sigma converter, then the advantages outlined here are possible.

Further observe that the integrated error signal is second order shaped due to the fact that the fractional-N DSM 203 is third order. While there is little advantage to higher order shaping of the PEC DSM quantizer error due to the fact that the main residual errors will, in practice, be due to random DAC errors, there is some advantage to implementing a higher order PEC loop to reduce tones. Of course, if DAC errors can be minimized via appropriate circuit design and processing techniques, then higher order noise shaping may be useful.

The digital signal represented by $x_q$ in FIGS. 3 and 4 is applied to the error cancellation DAC at the phase/frequency detector, which in turn drives the charge pump. Choosing an appropriate DAC is based on analysis of speed, accuracy, and complexity requirements. Given a non ideal DAC, there will be error introduced by the integrated non-linearity (INL) and dynamic non-linearity (DNL) of the DAC. Because these errors may lead to unacceptable performance under certain circumstances, dynamic element matching (DEM) of the DAC may need to be utilized. One embodiment employs DEM at the update rate to gain enough shaping gain to achieve acceptable performance.

However, in other embodiments, based on system requirements, it may be advantageous to utilize an oversampled DEM scheme. This is easily achieved with a minor modification of the proposed digital architecture shown in FIGS. 3 and 4. Specifically, if one clocks the PEC DSM at a higher rate while feeding a zero input for the error signal e between updates of the fractional-N DSM, then one produces essentially the same PEC output signal as before, except for the fact that the quantization error, q, is shaped more aggressively. In particular, if we oversample by a factor of K, then the corner frequency of the shaping transfer function will increase by a factor of K, and given first order shaping, the in-band noise will drop by a factor of K. Unfortunately, the shaped noise resulting from DAC errors does not always take on a true first order shaping characteristic. As a result, the total in band noise generally drops as a sub-linear function of K. Nevertheless, significant improvement is obtained as K is increased. Depending on design specifications, an oversampling ratio of K=4 can be utilized. Higher performance may be possible with even higher values of K, although that may be limited by such factors as front end nonlinearity and overall DAC gain inaccuracy.

An appropriate DAC should be used to convert the correction signal generated in the PEC delta sigma modulator. Factors to consider in the design of the DAC include the number of bits, the achievable accuracy due to component matching, and the architecture tradeoffs resulting from binary and thermometer coding. Current steering may be needed in some embodiments, e.g., in order to achieve achieve high accuracy at sample rates of 20 MHz or more. Switched capacitor techniques may also be available but may add risk in terms of transients and kT/q noise.

The number of bits used will be based on system noise requirements and can be chosen to help ensure that under ideal circumstances PEC DSM quantization noise could be reduced. Typical embodiments can use 8 or 9 bits to ensure that under ideal circumstances the PEC DSM quantization noise could be reduced to a low enough level to become insignificant compared to other effects. In one embodiment, given a maximum range of plus and minus two unit intervals, 9 bits, ideally quantized and noise shaped, may produce adequate performance. Adequate performance will be defined by system noise performance requirements. For example, noise performance requirements may be on the order of 1 mUI (mille-unit interval) rms.

Another DAC parameter to be evaluated involves the DAC architecture. While the Pelgrom numbers, e.g. in a CMOS process based implementation, ultimately drive the accuracy calculations, the architecture is important in mitigating DAC mismatch error while preserving reasonable size and complexity. In considering the achievable accuracy, as described above, dynamic element matching (DEM) may be necessary in certain applications. Thermometer coding may be utilized for at least the most significant bits of the DAC. While DEM is most successful when applied to a fully thermometer coded structure, the complexity associated with 512 lines (for 9 bits) would make the digital interface and physical layout inefficient.

One approach to manage the complexity may utilize a two tiered system in which the top several bits of the DAC would be realized by thermometer coding and the lower bits would be realized by either a second layer of thermometer coding or binary coding. Thus, the top 4 or 5 bits are thermometer encoded, via 16 or 32 segments, with the remaining bits encoded either by a second tier of thermometer coding or straight binary coding. However, plausible DAC mismatch scenarios may result in unacceptable noise performance.

In conventional DEM implementations for DACs schemes are employed which attempt to noise shape the physical mismatch errors in the DAC as arbitrary signals are applied. As a result, completely generic schemes are used which will essentially guarantee good performance over all possible input signal scenarios. If one knows that the applied signals to a DAC will have certain properties, then one may exploit those properties to simplify or improve the DEM scheme.

Because the PEC delta sigma converter shapes the quantization noise it produces, the lowest order bits of its output are essentially always randomized in their behavior. This may be exploited by applying the low order bits directly to a binary DAC with no DEM. The random nature of the signals driving this DAC will provide DEM automatically. Thus, in certain realizations, only the higher order bits of the PEC delta sigma output need to be handled as in usual DEM schemes, thereby greatly reducing the hardware burden associated with DEM. For example, if the PEC DSM output were a 9 bit word and a full barrel shifting DEM scheme were employed, then separate lines would require logical processing at each conversion interval. If the bottom two bits were applied to a binary converter and only the top 7 bits applied to a separate converter having full DEM, then only 128 separate lines would need to be logically processed per conversion interval.

Thus, various embodiments of a phase error correction scheme have been described. The description of the invention set forth herein is illustrative, and is not intended to limit the scope of the invention as set forth in the following claims. Other variations and modifications of the embodiments disclosed herein, may be made based on the description set forth herein, without departing from the scope and spirit of the invention as set forth in the following claims.

What is claimed is:

1. A method for generating a noise cancellation signal in a fractional-N phase-locked loop, the method comprising:
   supplying a divide value to a first delta sigma modulator;
   generating a divide control signal in the first delta sigma modulator to control a divide value of a feedback divider in the phase-locked loop;
   integrating an error term in the first delta sigma modulator, the error term indicative of a difference between a value of the generated divide control signal and the divide value supplied to the first delta sigma modulator; and
   generating a phase error cancellation signal by quantizing the integrated error term using a second delta sigma modulator.

2. The method as recited in claim 1 wherein generating a next value of the cancellation signal comprises:
   generating a first sum equal to the integrated error term minus the cancellation signal;
   generating a second sum equal to the error term plus the first sum; and
   integrating the second sum;
   generating a third sum equal to the second sum plus a dither term; and
   truncating the third sum to generate the next value of the cancellation signal.

3. The method as recited in claim 1 wherein the first delta sigma modulator is at least a second order delta sigma modulator.

4. The method as recited in claim 1 wherein the second delta sigma modulator is a first order delta sigma modulator.

5. The method of claim 1 further comprising:
   generating the error term in the first delta sigma modulator, the error term being based on a difference between at least a portion of the value of the generated divide control signal and at least a portion of the divide value supplied to the first delta sigma modulator.

6. The method as recited in claim 1 further comprising utilizing the error term in the second delta sigma modulator to quantize the integrated error term, thereby limiting the low pass filter effects of the second delta sigma modulator in the cancellation signal.

7. The method as recited in claim 6 wherein the shaped quantization noise is first order.

8. The method as recited in claim 6 further comprising:
   generating the cancellation signal in the second delta sigma modulator at a rate above an update rate of the phase-locked loop; and
   supplying a zero input for the error term between updates of the first delta sigma modulator.

9. The method as recited in claim 6 wherein the cancellation signal consists essentially of the integration of the error term plus shaped quantization noise.

10. The method as recited in claim 9 further comprising generating the cancellation signal at or below an update rate of the phase-locked loop.

11. The method as recited in claim 6 wherein the cancellation signal comprises the integration of the error term plus shaped quantization noise.

12. The method as recited in claim 11 wherein the shaped quantization noise is first order.

13. An integrated circuit comprising:
   a fractional N phase-locked loop circuit including a feedback divider circuit coupled to receive a divide control signal that approximates a divide value over time;
   an integrator coupled to receive an error signal and supply an integrated error signal, the error signal being a difference between the divide value and the divide control signal; and
   a first delta sigma modulator coupled to receive the integrated error signal and the error signal and generate a cancellation signal to correct phase errors in the phase-locked loop introduced by the feedback divider circuit.

14. The integrated circuit of claim 13 further comprising:
   a summing circuit coupled to generatethe error signal being the difference between the
   divide value and the divide control signal.

15. The integrated circuit as recited in claim 13 wherein the first delta sigma modulator is at least a first order delta sigma modulator.

16. The integrated circuit as recited in claim 13 wherein the first delta sigma modulator further comprises:
   a first summing circuit coupled to generate a first sum equal to the integrated error signal minus the cancellation signal;
   a second summing circuit coupled to generate a second sum equal to the error term plus the first sum;
   an integrator coupled to receive the second sum and integrate the second sum;
   a third summing circuit coupled to generate a third sum equal to the second sum plus a dither signal.

17. The integrated circuit as recited in claim 16 wherein the cancellation signal is a truncation of the third sum.

18. The integrated circuit as recited in claim 13 further comprising:
a second delta sigma modulator coupled to receive the divide value and generate the divide control signal, the second delta sigma modulator including the integrator.

19. The integrated circuit as recited in claim 18,
wherein the first delta sigma modulator is operating at a rate above an update rate of the phase-locked loop; and
wherein a zero is received for the error signal between updates of the second delta sigma modulator, the second delta sigma modulator being operated below the rate of the first delta sigma modulator.

20. The integrated circuit as recited in claim 18 wherein the second delta sigma modulator is at least a third order delta sigma modulator.

21. The integrated circuit as recited in claim 18 wherein the second delta sigma modulator is a second order delta sigma modulator.

22. A method for generating a noise cancellation signal in a delta-sigma fractional-N phase-locked loop, the method comprising:
supplying an error term and an integrated error term to a delta sigma modulator circuit, the error term indicating a difference between a first divide signal and a second divide signal supplied to a divider circuit in the phase-locked loop; and
generating a phase error cancellation signal by quantizing the integrated error term using the delta sigma modulator.

23. The method as recited in claim 22 wherein the phase error cancellation signal comprises the integrated error term and shaped quantization error.

24. The method as recited in claim 22 further comprising generating the error term and the integrated error term in another delta sigma modulator generating the second divide signal and receiving the first divide signal.

25. The method as recited in claim 22 comprising coupling the cancellation error signal to a charge pump to adjust an output of the phase-locked loop according to the phase error cancellation signal.

26. The method of claim 22 further comprising:
generating the error term, the error term being based on a difference between at least a portion of the first divide signal and at least a portion of the second divide signal supplied to the divider circuit.

27. The method as recited in claim 22 wherein the phase error cancellation signal consists essenially of the integrated error term and shaped quantization error.

28. The apparatus as recited in claim 27 further wherein the means for generating the phase error cancellation is operated at or below an update rate of the phase-locked loop.

29. An apparatus for generating a noise cancellation signal in a fractional-N phase-locked loop, the apparatus comprising:
means for generating a divide control signal that over time approximates a received divide signal;
means for generating an error term indicative of a difference between the received divide signal and the generated divide control signal;
means for receiving the error term and generating an integrated error term therefrom; and
means for generating a phase error cancellation signal by quantizing the integrated error term,
wherein the means for generating the phase error cancellation signal is coupled to receive the integrated error term.

30. The method as recited in claim 29 wherein the phase error cancellation signal consists essentially of the integrated error term and shaped quantization error.

31. The apparatus as recited in claim 29 further wherein the means for generating the phase error cancellation is operated at or below an update rate of the phase-locked loop.

32. The apparatus as recited in claim 29 wherein the phase error cancellation signal comprises the integrated error term and shaped quantization error.

* * * * *

UNITED STATES PATENT AND TRADEMARK OFFICE
CERTIFICATE OF CORRECTION

PATENT NO.        : 7,068,110 B2
APPLICATION NO. : 10/878089
DATED             : June 27, 2006
INVENTOR(S)       : Doug Frey, Axel Thomsen and Ligang Zhang It is certified that error appears in the above-identified patent and that said Letters Patent is hereby corrected as shown below:

At Col. 12, beginning at line 9, please replace claim 28 with the following claim:
  28. The apparatus as recited in claim 27 further comprising generating the phase error cancellation signal at or below an update rate of the phase-locked loop.

At Col. 12, beginning at line 27, please replace claim 30 with the following claim:
  30. The apparatus as recited in claim 29 wherein the means for generating the phase error cancellation signal is coupled to receive the error term.

Signed and Sealed this

Third Day of October, 2006

JON W. DUDAS
*Director of the United States Patent and Trademark Office*

UNITED STATES PATENT AND TRADEMARK OFFICE
CERTIFICATE OF CORRECTION

PATENT NO. : 7,068,110 B2  Page 1 of 1
APPLICATION NO. : 10/878089
DATED : June 27, 2006
INVENTOR(S) : Doug Frey, Axel Thomsen and Ligang Zhang It is certified that error appears in the above-identified patent and that said Letters Patent is hereby corrected as shown below:

At Col. 12, beginning at line 9, please replace claim 28 with the following claim:

28. The method as recited in claim 27 further comprising generating the phase error cancellation signal at or below an update rate of the phase-locked loop.

Signed and Sealed this

Twenty-fourth Day of April, 2007

JON W. DUDAS
*Director of the United States Patent and Trademark Office*